United States Patent
Kocon

[11] Patent Number: 6,107,127
[45] Date of Patent: Aug. 22, 2000

[54] METHOD OF MAKING SHALLOW WELL MOSFET STRUCTURE

[76] Inventor: Christopher B. Kocon, 16 Grace Dr., Plains, Pa. 18705-3501

[21] Appl. No.: 09/145,513

[22] Filed: Sep. 2, 1998

[51] Int. Cl.⁷ .................................................. H01L 21/8238
[52] U.S. Cl. .......................... 438/217; 438/289; 438/510; 438/514; 438/527
[58] Field of Search ..................................... 438/197, 218, 438/229, 282, 289, 294, 299, 302, 510, 514, 527, 174, 194, 217

[56] References Cited

U.S. PATENT DOCUMENTS

| | | | |
|---|---|---|---|
| 4,442,589 | 4/1984 | Doo et al. | 438/297 |
| 4,803,179 | 2/1989 | Neppl et al. | 437/70 |
| 4,956,700 | 9/1990 | Blanchard | 357/23.4 |
| 5,478,763 | 12/1995 | Hong | 438/286 |
| 5,538,907 | 7/1996 | Aronowitz et al. | 438/200 |
| 5,677,215 | 10/1997 | Goo | 438/257 |
| 5,683,923 | 11/1997 | Shimizu et al. | 438/257 |

FOREIGN PATENT DOCUMENTS 19608003  11/1997  Germany .

*Primary Examiner*—John F. Niebling
*Assistant Examiner*—Christopher Lattin
*Attorney, Agent, or Firm*—Charles E. Wands

[57] ABSTRACT

To form a shallow well MOSFET, an epitaxial layer is subjected to a blanket implant of impurities, so as to form a very shallow well region that defines a PN junction with the epitaxial layer. A field oxide layer is selectively formed on a portion of the shallow well region, and a gate insulator layer is formed on the exposed portion of the shallow well region contiguous with the field insulator layer. A polycrystalline silicon spacer-gate layer is non-selectively deposited on the field insulator layer and the gate insulator layer, forming a multiple thickness implant mask. The resulting structure is subjected to one or more high energy impurity implants, to overdose and thereby convert a portion of the shallow well region to the conductivity of the epitaxial layer. This extends the PN junction up to the surface of the well region beneath the gate insulator layer, thereby defining the length of the channel between the side edge of the field oxide layer and the extended PN junction. A polysilicon planarization layer is then non-selectively formed on the spacer layer, followed by a planarization etch, to define the thickness of the gate layer. The field insulator layer is then stripped, and source and drain regions are formed. What results is a shallow well insulated gate field effect semiconductor device having decreased resistance and current pinching in the channel neck region, relative to that of a conventional process, thereby providing increased power handling capability and efficiency.

6 Claims, 9 Drawing Sheets

METHOD OF MAKING SHALLOW WELL MOSFET STRUCTURE

FIELD OF THE INVENTION

The present invention relates in general to semiconductor devices and processes for their manufacture, and is particularly directed to a new and improved process for manufacturing a shallow well insulated gate field effect semiconductor device, and a device made by that process, having decreased resistance and current pinching in the neck region of the channel, thereby providing augmented power handling capability and efficiency of the resulting structure.

BACKGROUND OF THE INVENTION

In conventional processes for manufacturing a MOSFET device, the well depth required for achieving a desired channel length is dependent upon or dictated by lateral and vertical diffusion of dopant material beneath the edge of a polysilicon gate. Where the device being formed is intended to be a reduced depth or shallow well device, such a diffusion dependency tends to make the resulting device prone to short channel effects and high drain-source leakage. More particularly, in a conventional MOSFET process, respective steps of which for an N-channel or P-well device are shown in fragmentary, diagrammatic, sectional FIGS. 1–7, an N− epitaxial layer 11 is initially ubiquitously deposited upon an underlying N+ silicon substrate 13 (FIG. 1), to a prescribed thickness and resistivity for achieving a prescribed breakdown voltage.

Next, a gate insulator (oxide) layer 15 is grown on the top surface of the N− epitaxial layer 11 (FIG. 2), followed by non-selective deposition of a layer 19 of polycrystalline silicon (FIG. 3), which is to serve as the gate electrode for the device. The gate oxide 15 and polysilicon layer 19 are then selectively etched (FIG. 4) to define a self-aligned mask 21 for subsequent well and source implants.

As shown in FIG. 5, a P-well region 25 is then formed in the epitaxial layer 11 by means of a blanket or non-selective implant of P-type impurities 23, having an energy and concentration that produces the P-well region 25 adjacent to the side edge 27 of the gate mask 21. This structure is then subjected to a drive-in diffusion/anneal, which increases the depth of the P-well region 25 and causes lateral diffusion of the implanted P-well impurities beneath the gate mask 21, so that a resulting PN junction 27, between the P-well region 25 and the N− epitaxial layer 11, extends from the bottom 29 of the well P-region to a location 31 beneath the insulated gate structure.

Next, as shown in FIG. 6, an N+ source region 33 is selectively implanted into the well adjacent to the side edge 27 of the gate, using a separate photoresist mask and an oxide spacer or photoresist mask overlying the P-well region 25, to define the size of the source region. An area 50 directly below the gate oxide 15 and located between the N+ source region 33 and drain 11, 13 is now formed and defined as a channel area. Following formation of the N+source region 33, a further P+ implant is carried out, to Do form a surface P+ body region 35 within the P-well region (FIG. 7). The structure is then annealed for dopant activation and repair of damaged lattice sites. In the final device, the back side of the substrate will serve as a drain contact.

FIG. 8 diagrammatically illustrates the concentration of current flow during the on-state of a device manufactured using the conventional processing sequence of FIGS. 1–7. As pointed out above, because the length of the channel 50 is determined by lateral and vertical diffusion of dopant material beneath the side edge 27 of the gate structure, at the location of the well implant to form a relatively shallow well device (less than two microns in the illustrated example), the resulting device is prone to short channel effects and high drain-source leakage and in extreme cases breakdown voltage reduction.

The short channel effects are evident when the device is in conduction or on-state. In the on-state, charge carriers flow through the channel region between the source and drain regions under the control of the voltage applied to the gate electrode relative to the voltage applied to the source region. In the illustrated device having a P-type channel region 50 disposed between the N-type source region 33 and drain regions 11, 13 a positive voltage is applied to the gate electrode 19 for attracting electrons toward the surface of the channel region. The attracted electrons, when of sufficient concentration, invert the conductivity type of a narrow portion of the P-type channel region adjacent to the substrate surface to N-type for establishing a continuous path of N-type conductivity from the source region 33 through the channel region 50 to the drain region 11 and 13 down to the backside drain contact.

The applied gate-source voltage at which a significant current start to flow is called threshold voltage of the device. Normally for non-short channel devices this voltage is independent of gate length and width. As the channel length is reduced, the depletion layer of the source and drain junction become comparable to the channel length. At this point punch-through will occur. At punch-through, the two depletion layers merge and the gate can no longer control the current. The threshold voltage of the device is reduced and variable.

Threshold voltage control is the basic requirement for a MOSFET device. In the off-state or blocking state, the device is expected to support a desired drain-source voltage. Again, as the channel length is reduced, the depletion layers of the source and drain junctions become comparable to the channel length. At this point, punch-through will occur, so that the two depletion layers merge and the device can no longer support voltage. This premature breakdown voltage reduction due to short a channel greatly reduces the device's capability and usage.

SUMMARY OF THE INVENTION

In accordance with the present invention, these drawbacks are obviated by a process for shallow well MOSFET formation, in which (shallow) channel width is precisely established prior to and independent of polysilicon gate formation and subsequent diffusion steps. This procedure results in a shallow well insulated gate field effect semiconductor device having decreased resistance and current pinching in the channel neck region, relative to that of the conventional process described above, and thereby providing increased power handling capability and efficiency.

For this purpose, in the improved shallow well processing sequence of the present invention, following initial deposition of an epitaxial layer upon an underlying silicon substrate, the top surface of the epitaxial layer is subjected to a blanket implant of opposite conductivity type impurities, thereby forming a very shallow well region that defines a PN junction with the epitaxial layer. Next, a relatively thick field insulator layer is formed on the surface of the shallow well region.

This thick field insulator region is then selectively etched, to form a field insulator mask overlying overlies a first portion of the shallow well region, and exposing a second portion of the shallow well region, adjacent thereto. A gate insulator layer is formed on the exposed portion of the shallow well region contiguous with the field insulator layer. Following the formation of the gate insulator layer, a polycrystalline silicon spacer layer, to be used to form a conductive gate layer, is non-selectively deposited atop the field insulator layer and the gate insulator layer. As a result of this non-selective spacer layer formation, the surface of the well region is covered with a multiple thickness implant mask.

A first portion of the mask has the combined thickness of the field insulator layer and the polysilicon spacer layer. A second portion of the mask contains a relatively thick portion of the spacer layer immediately adjacent to the side of the field insulator layer and the thickness of the gate insulator layer. The width of the second portion of the mask defines the channel length between that portion of the well region beneath and aligned with the field insulator layer and an extended portion of the PN junction to formed between the well region and that portion of the well region converted to N type conductivity during a subsequent implant step. The thicknesses of the first and second portions of the mask layer are sufficient to block the penetration of dopant impurities. A third second portion of the mask contains only the thickness of the silicon spacer layer and the gate insulator layer, so that it's thickness allows the penetration of dopant impurities during subsequent implant.

Following formation of the polysilicon spacer layer, the surface of the resulting structure is subjected to one or a plurality of high energy impurity implants, so as to overdose the second portion of the shallow well region, and thereby convert that portion of the shallow well region to opposite type conductivity—that of the epitaxial layer. This extends the PN junction up to the surface of the well region beneath the gate insulatorlayer, thereby defining the length of the channel between the side edge of the field oxide layer and the extended PN junction.

A polysilicon planarization layer is then non-selectively formed on the layer of polysilicon spacer layer, followed by a planarization etch, which serves to both planarize and reduce the thickness of the compound polysilicon material to the desired thickness of a polysilicon gate layer, having a level below the thickness of the field insulator layer. Following the planarization etch, the field insulator layer is stripped, exposing that portion of the shallow well region adjacent to the gate oxide layer and the polysilicon gate layer, which define a self-aligned mask for subsequent body and source implants. Formation of the source and drain regions may proceed as described above referring to the conventional process of FIGS. 1–7.

DETAILED DESCRIPTION

The improved shallow well processing sequence of the present invention will now be described with reference to FIGS. 9–21. As a non-limiting example, the device formed is a P-well (N-channel) MOSFET structure. It is to to be understood, however, that the conductivity types for the various materials and dopants may be reversed, and an N-well or P-channel device may be formed in the same manner. All figures show fragmentary, diagrammatic, sectional views of a MOSFET, but final devices are typically made as an is array of the shown MOSFET and/or its mirror images. Also, the ranges for the parameters of the respective steps are for purposes of illustrating a non-limiting example.

Figure 1:
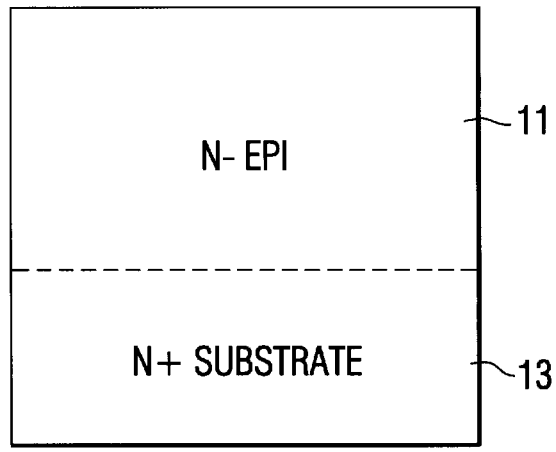
FIGS. 1–7 show respective steps of a conventional shallow well MOSFET formation process.
Figure 2:
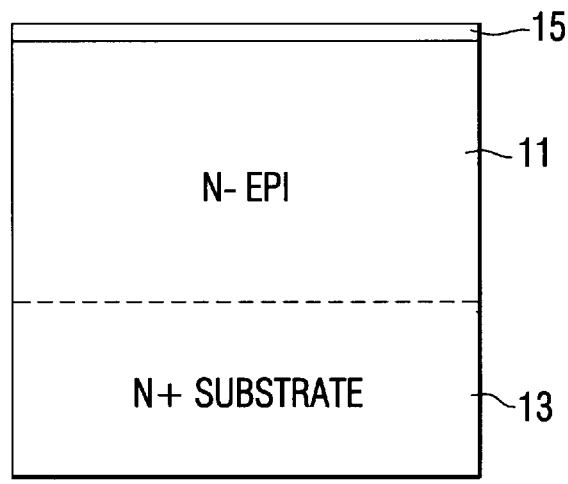
Figure 3:
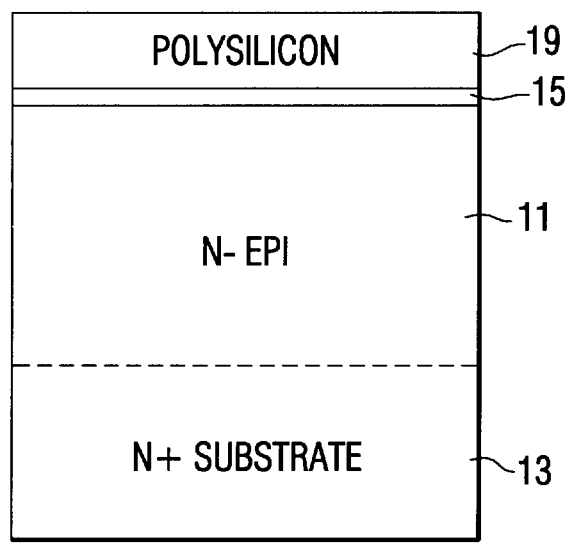
Figure 4:
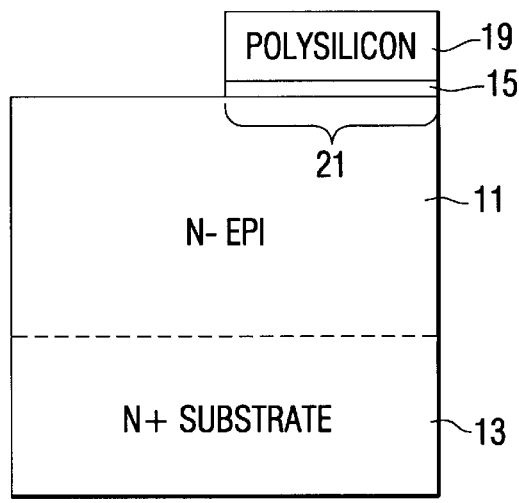
Figure 5:
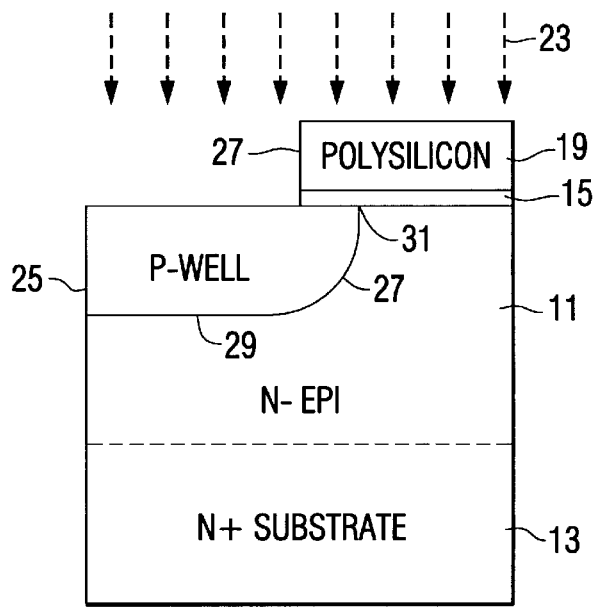
Figure 6:
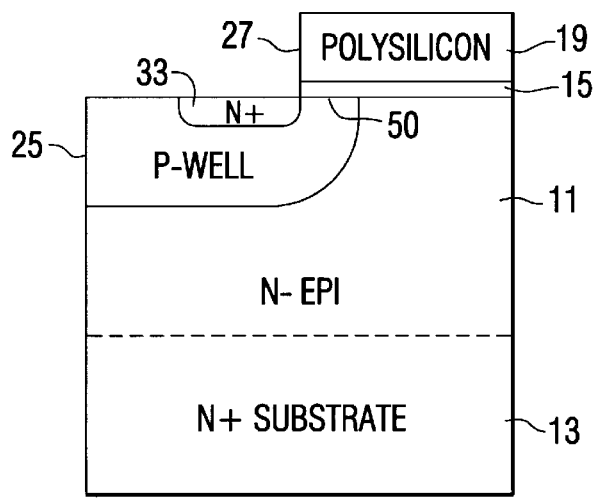
Figure 7:
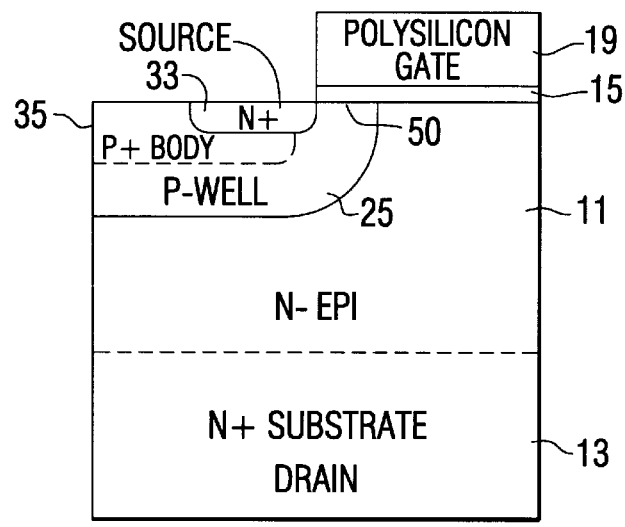
Figure 8:
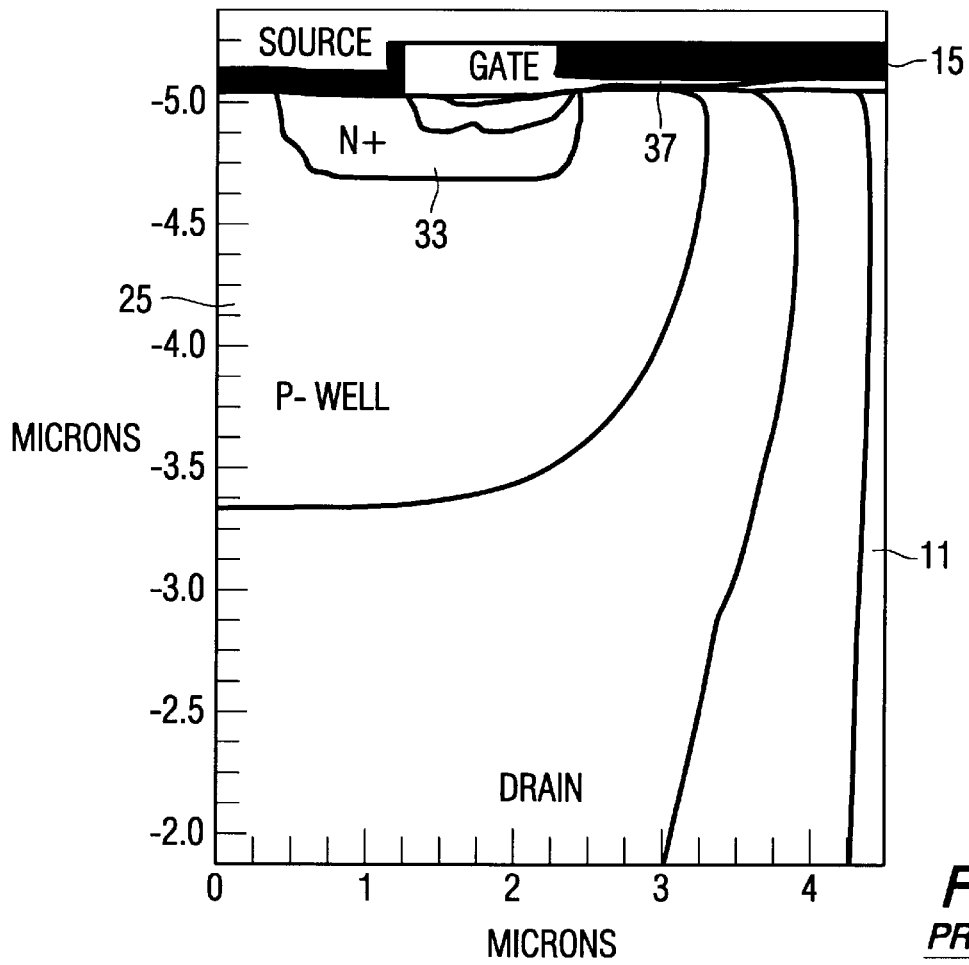
FIG. 8 diagrammatically illustrates the concentration of current flow during the on-state of a device manufactured using the conventional processing sequence of FIGS. 1–7.
Figure 9:
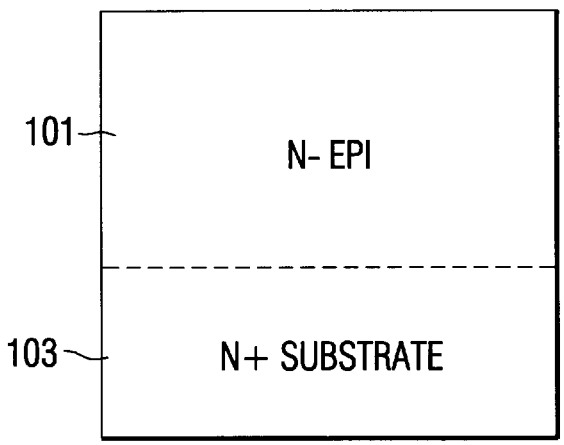
FIGS. 9–20 show respective steps of a shallow well MOSFET processing sequence of the present invention.

As shown in FIG. 9, like the conventional process shown in FIGS. 1–7, the shallow well processing sequence of the invention begins with the deposition of a ubiquitous N-epitaxial layer 101 upon an underlying N+ silicon substrate 103, to a prescribed thickness and resistivity for a prescribed breakdown voltage device (e.g., having a thickness in a range on the order of from 3 $\mu$m to 24 $\mu$m and a resistivity on the order of from 0.20 $\Omega$m to 59 $\Omega$m).

Figure 10:
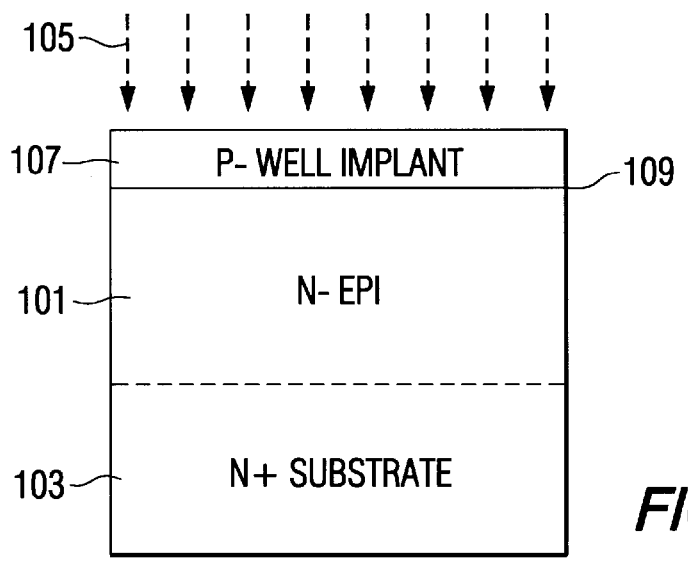

Next, as shown in FIG. 10, the top surface of the N-epitaxial layer 101 is subjected to a blanket implant of P-type impurities, to a prescribed depth (e.g., in a range on the order of from 0.05 $\mu$m to 0.3 $\mu$m) and dosage (e.g., in a range of from $8\times10^{12}$ atoms/cm to $1.2\times10^{13}$ atoms/cm ), thereby forming a very shallow P region 107 (e.g., to a depth on the order of 0.6 $\mu$m to 1.0 $\mu$m). This implant defines a PN junction 109 with N– epitaxial layer 101.

Figure 11:
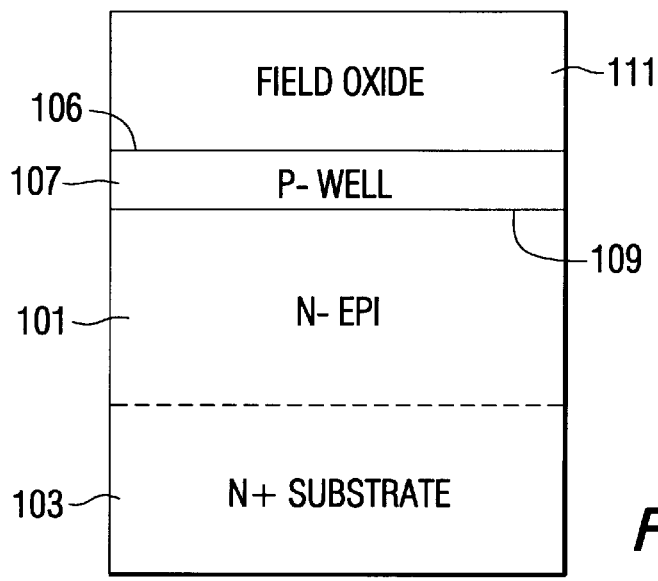
Figure 12:
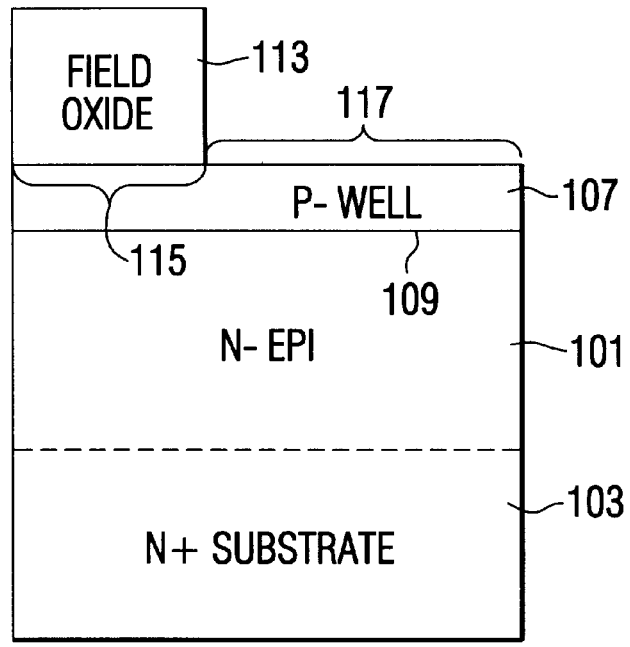

As shown in FIG. 11, a relatively thick field to insulator (oxide) layer 111 (e.g., having a thickness on the order of from 8,000 to 12,000 angstroms) is then formed on the top surface 110 of the shallow P region 107 at the surface portion of the N– epitaxial layer 101, and then selectively etched, as shown in FIG. 12, to form a field oxide mask 113, that overlies a first portion 115 of the shallow P well region 107, and exposes a second portion 117 of the shallow P well region 107, adjacent to the first surface portion 115.

Figure 13:
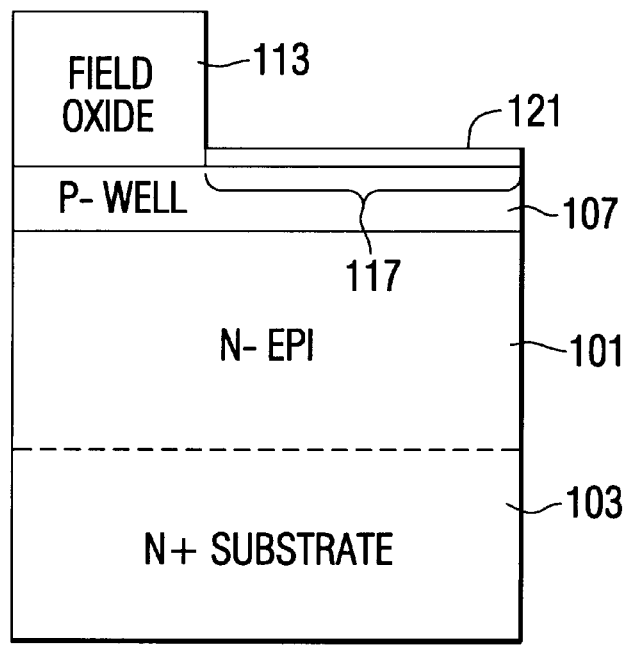
Figure 14:
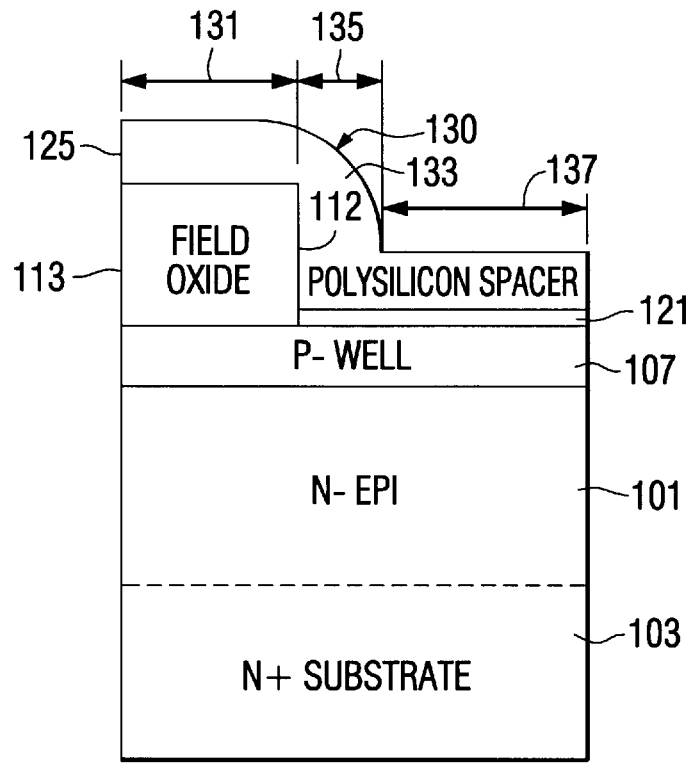

As shown in FIG. 13, a gate insulator layer 121 is formed on the exposed portion 117 of the shallow P well region 107 to a thickness in a range on the order of from 200 to 1000 angstroms, and contiguous with field oxide layer 111. Following formation of gate insulator layer 121, a polycrystalline silicon spacer layer 125, to be used to form a conductive gate layer, is non-selectively deposited to a thickness on the order of from 3000 Angstroms to 5000 Angstroms atop field oxide layer 111 and the gate insulator layer 121, as shown in FIG. 14.

As a result of this non-selective spacer layer formation, the surface of the P well region 107 is covered with a multiple thickness implant mask 130. A first portion 131 of the mask contains the compound thickness of the field oxide layer 113 and the polysilicon spacer layer 125 atop the field oxide layer 113. A second portion 133 of the mask contains a relatively thick portion 135 of the spacer layer 125 immediately adjacent to the side 112 of the field oxide layer 113 and the thickness of the gate insulator layer 121. The width or horizontal dimension of the second portion 135 of the mask defines the channel length between that portion of the well region beneath and aligned with the side edge 112 of the field oxide layer 113 and a PN junction formed between the well region and that portion of the well region that is converted to N type conductivity during a subsequent implant step, as will be described.

The thicknesses of the first and second portions of the mask layer 130 are sufficient to block the penetration of dopant impurities during this implant step. A third portion 137 of the mask 130 contains only the thickness of the silicon spacer layer 125 and the gate insulator layer 121, so that it's reduced thickness allows the penetration of dopant impurities during the subsequent implant step.

Figure 15:
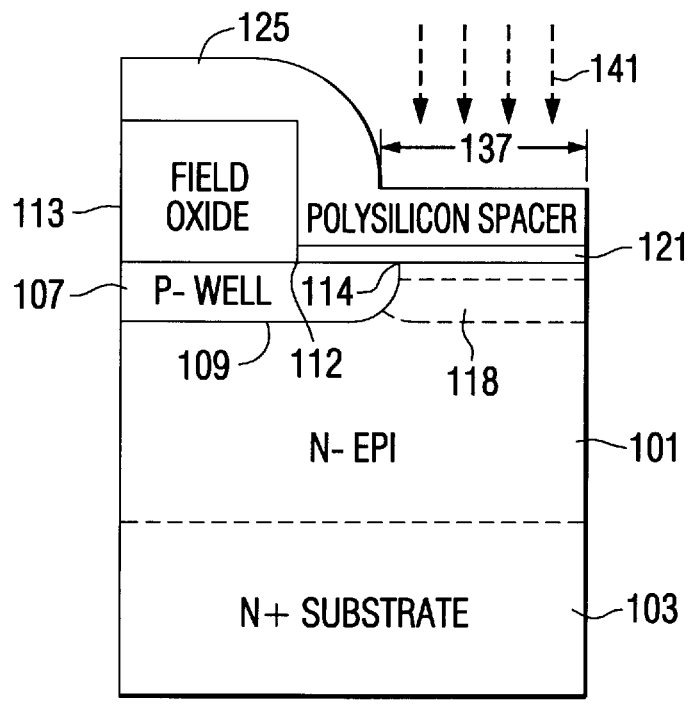

Following formation of the polysilicon spacer layer 125, the surface of the resulting structure is subjected to one or a plurality of high energy N+ impurity implants, shown at 141 in FIG. 15, to overdose that portion 118 of the second portion 117 of the shallow P well region 107 underlying the third portion 137 of the mask 130, and thereby convert that portion of the P-well region 107 to N-type conductivity. This has the effect of extending the PN junction 109 up to the surface 114 of the well region beneath the gate insulator layer 121. This method uses polysilicon as an un-etched spacer for high energy N+ implants. The other obvious option is to non-selectively etch polysilicon and thereby create an etched polysilicon spacer.

Figure 16:
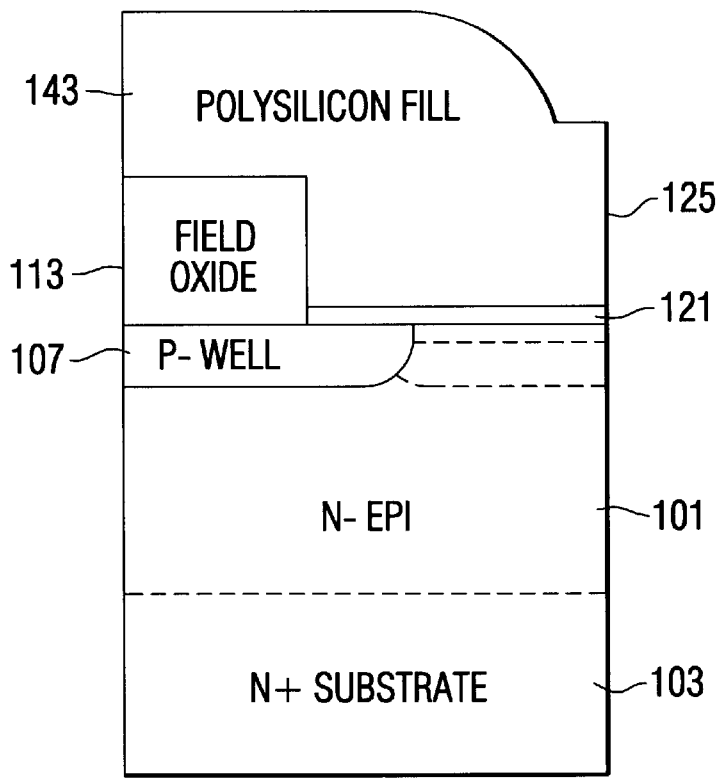
Figure 17:
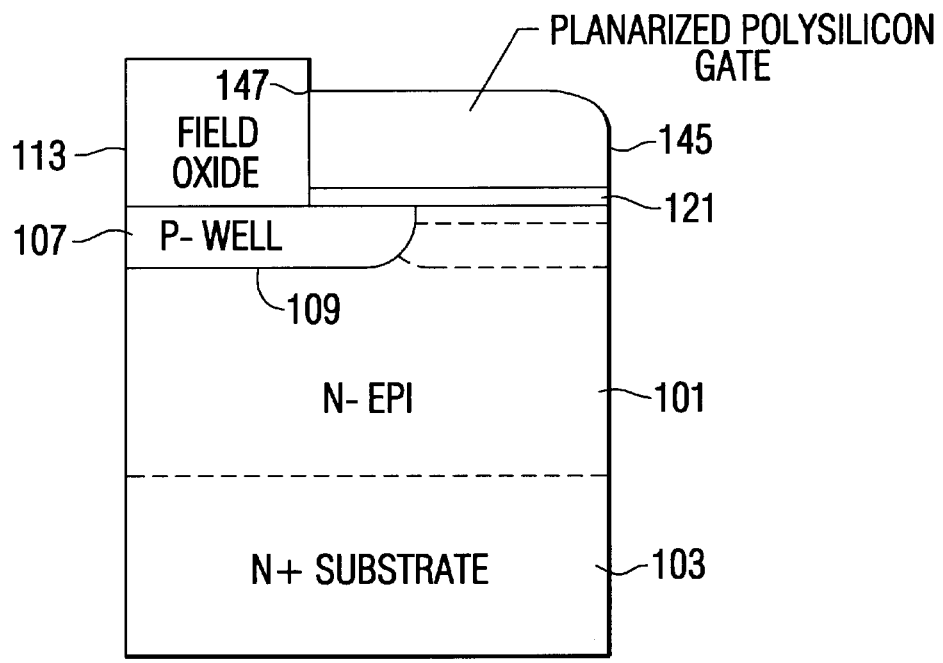

Next, as shown in FIG. 16, a relatively thick (e.g., 0.3 microns) planarization layer of polysilicon 143 is non-selectively formed on the layer of polysilicon spacer layer 125. This step is followed by a planarization etch, shown in FIG. 17, which serves to both planarize and reduce the thickness of the compound polysilicon material to the desired thickness of a polysilicon gate layer 145, having a level 147 below the thickness of the field insulator layer 113. As a non-limiting example, the polysilicon gate layer 145 may have a thickness in a range on the order of from 5000 to 8000 angstroms.

Figure 18:
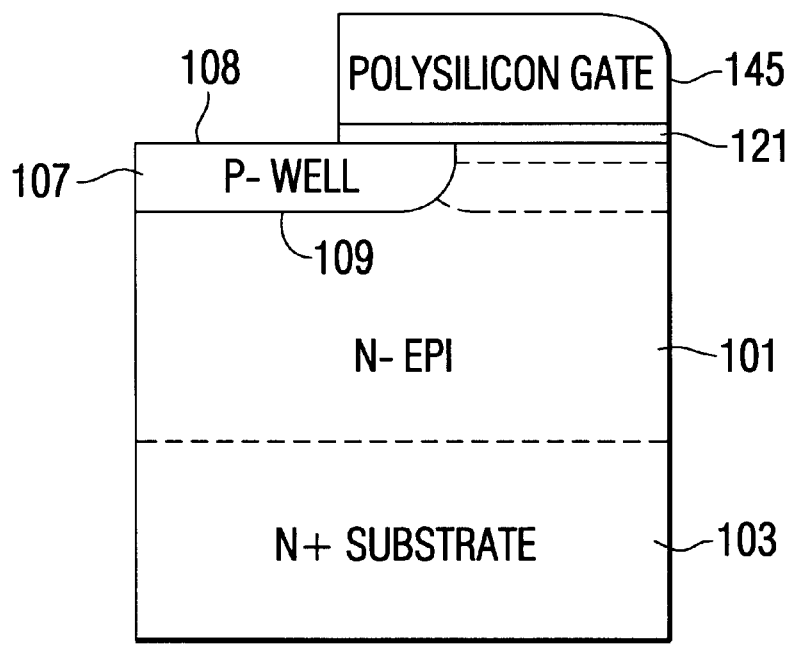

Following the planarization etch, the field oxide layer 113 is stripped off with an oxide etch, such as a reactive ion dry etch, as shown in FIG. 18, exposing surface portion 108 of the shallow P well region 107 adjacent to the gate oxide layer 121 and the polysilicon gate layer 145, which define a self-aligned mask for subsequent body and source implants.

Figure 19:
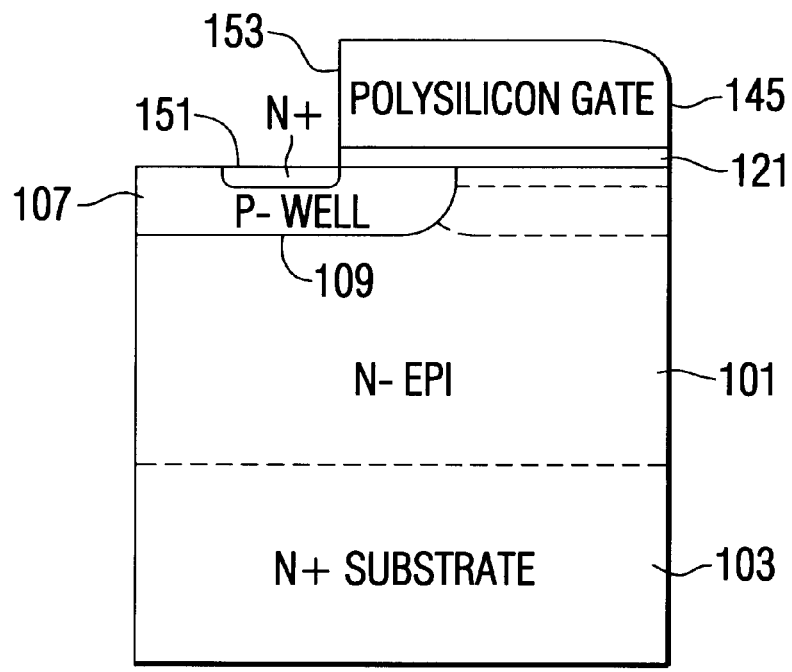

Formation of these source and drain regions may proceed as described above with reference to the conventional process of FIGS. 1–7. Namely, as shown in FIG. 19, an N+ source region 151 may be implanted into the shallow well adjacent to the side edge 153 of the polysilicon gate layer 145, using a separate photoresist mask, overlying the shallow P-well region 107, to define the size of the N+ source region 151. As a non-limiting example, the N+ source region may 151 have an impurity concentration on the order of from $5 \times 10^{19}$ atoms/cm$^3$ to $2 \times 10^{20}$ atoms/cm$^3$ and a depth lying in a range on the order of from 0.1 μm to 0.3 μm. The channel region is defined as a silicon region in close proximity to gate oxide region located between source edge 155 and end of P-well region 160.

Figure 20:
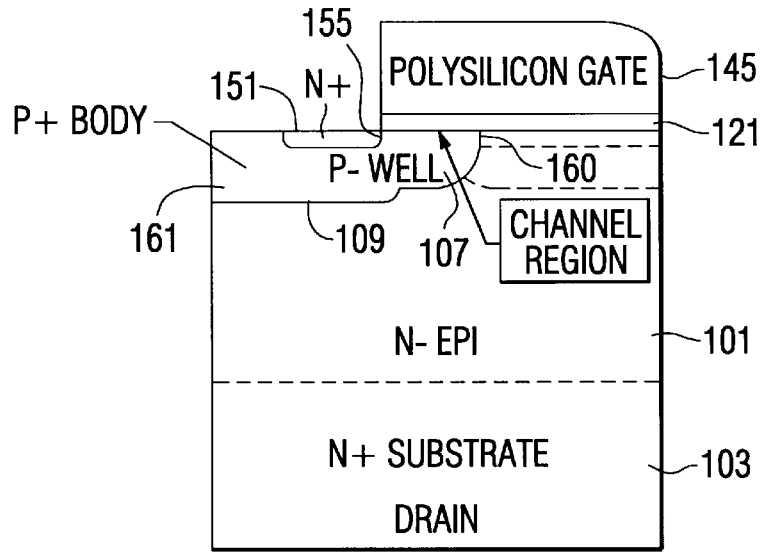

Following formation of the N+source region 151, a further P+ body implant is carried out, as shown in FIG. 20, to form a surface P+body region 161 in the P-well region 107. This implant may employ a dosage in a range of from $1 \times 10^{15}$ atoms/cm$^3$ to $1 \times 10^{16}$ atoms/cm$^3$ and depth in a range on the order of from 0.2 μm to 0.3 μm. The structure is then annealed for dopant activation and repair of damaged lattice sites.

Figure 21:
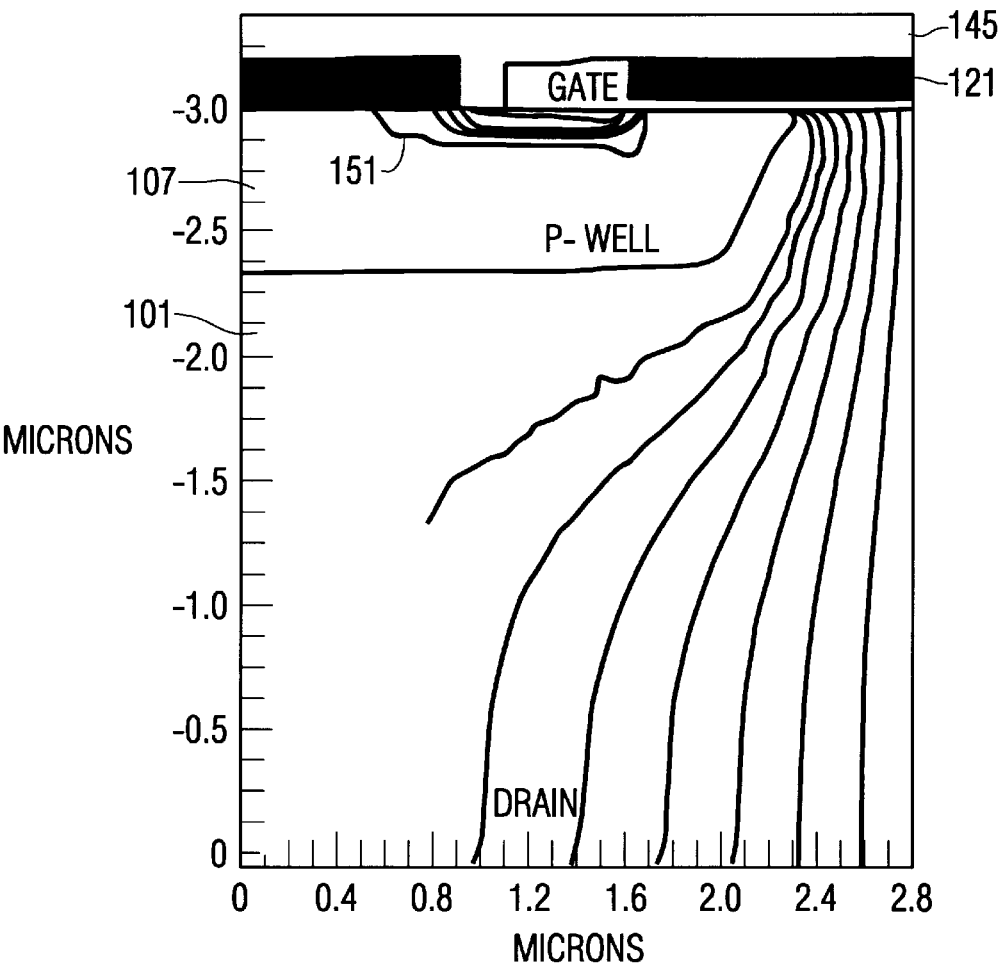
FIG. 21 diagrammatically illustrates the concentration of current flow during the on-state of a device manufactured using the processing sequence of FIGS. 9–20.

FIG. 21 diagrammatically illustrates the concentration of current flow during the on-state of a device manufactured in accordance with the processing sequence of FIGS. 9–20. As pointed out above, because the to length of the channel within the shallow P-well channel is determined by the thickness of the polysilicon spacer layer, rather than by lateral and vertical diffusion of well dopant material as in the conventional device of FIGS. 1–8, what results is a shallow well insulated gate field effect device having decreased resistance and current pinching in the channel neck region, and thereby increased power handling capability and efficiency.

While I have shown and described an embodiment in accordance with the present invention, it is to be understood that the same is not limited thereto but is susceptible to numerous changes and modifications as are known to a person skilled in the art, and I therefore do not wish to be limited to the details shown and described herein, but intend to cover all such changes and modifications as are obvious to one of ordinary skill in the art.

What is claimed:

1. A method of manufacturing an insulated gate field effect semiconductor device comprising the steps of:
    (a) providing a semiconductor substrate having a first surface layer of a first conductivity type, and a second layer of a second conductivity type beneath and forming a PN junction with said first surface layer;
    (b) selectively forming a gate insulator layer on a first portion of said first surface layer;
    (c) converting a first part of said first portion of said first surface layer to said second conductivity type, said first part of said first portion of said first surface layer being contiguous with said gate insulator layer and said second layer of said second conductivity type beneath said first surface layer, so as to extend said PN junction to said gate insulator layer;
    (d) forming a layer of conductive gate material on said gate insulator layer overlying a second part of said first portion of said first surface layer adjacent to said first part thereof; and
    (e) forming a region of said second conductivity type in said first surface layer adjacent to said second part of said first portion of said first surface layer overlaid by said layer of conductive gate material.

2. A method according to claim 1, wherein step (b) comprises
    (b1) selectively forming a field insulator layer of a first thickness on a selected portion of said first surface layer, adjacent to said first portion thereof, and
    (b2) selectively forming said gate insulator layer to a second thickness, less than said first thickness, on said first portion of said first surface layer; and wherein step (c) comprises
    (c1) non-selectively forming a layer of spacer material on said field insulator layer and said gate insulator layer, so that a first portion of said layer of spacer material, overlying said second part of said first portion of said first surface layer, has a first thickness, and a second portion of said layer of spacer material, overlying said first part of said first portion of said first surface layer, has a second thickness less than said first thickness thereof, and
    (c2) implanting the structure resulting from step (c1) with second conductivity type impurities, so that said second conductivity type impurities pass through said second portion of said layer of spacer material overlying said first part of said first portion of said first surface layer, and convert said first part of said first portion of said first surface layer to said second conductivity type, but are blocked from entering said selected portion and said first part of said first portion of said first surface layer by said first portion of said layer of spacer material.

3. A method according to claim 2, wherein said layer of spacer material is comprised of said layer of conductive gate material, and wherein step (d) comprises
    (d1) non-selectively forming a planarization layer of said conductive gate material on said layer of spacer material, and (d2) etching back said planarization layer of conductive gate material to a level below that of said field insulator layer.

4. A method according to claim 3, wherein step (e) comprises (e1) removing said field insulator layer, so as to expose said selected portion of said first surface layer, and (e2) introducing impurities of said second conductivity type into a prescribed part of said selected portion of said first surface layer.

5. A method of manufacturing an insulated gate field effect semiconductor device comprising the steps of:

(a) introducing impurities of a first conductivity type into a surface of a semiconductor substrate of said second conductivity type, so as to form a first surface layer of said first conductivity type extending from said surface of said semiconductor substrate and forming a PN junction with a second layer spaced apart from said surface of said semiconductor substrate by a prescribed depth;

(b) selectively forming a field insulator layer of a first thickness on a selected portion of said first surface layer, adjacent to said first portion thereof, and selectively forming said gate insulator layer to a second thickness, less than said first thickness, on said first portion of said first surface layer;

(c) non-selectively forming a layer of conductive gate material as a layer of spacer material, on said field insulator layer and said gate insulator layer, so that a first portion of said layer of spacer material, overlying said second part of said first portion of said first surface layer, has a first thickness, and a second portion of said layer of spacer material, overlying said first part of said first portion of said first surface layer, has a second thickness less than said first thickness thereof, and implanting the resulting structure with second conductivity type impurities, so that said second conductivity type impurities pass through said second portion of said layer of spacer material overlying said first part of said first portion of said first surface layer, and convert said first part of said first portion of said first surface layer to said second conductivity type, but are blocked from entering said selected portion and said first part of said first portion of said first surface layer by said first portion of said layer of spacer material;

(d) non-selectively forming a planarization layer of said conductive gate material on said layer of spacer material, and etching back said planarization layer of conductive gate material to a level below that of said field insulator layer, and (e) forming a region of said second conductivity type in said first surface layer adjacent to said second part of said first portion of said first surface layer overlaid by said layer of conductive gate material by removing said field insulator layer, so as to expose said selected portion of said first surface layer, and introducing impurities of said second conductivity type into a prescribed part of said selected portion of said first surface layer.

6. A method of manufacturing an insulated gate field effect semiconductor device comprising the steps of:

(a) providing a semiconductor substrate having a first surface layer of a first conductivity type, and a second layer of a second conductivity type beneath and forming a PN junction with said first surface layer;

(b) selectively forming a gate insulator layer on a first portion of said first surface layer;

(c) converting a first part of said first portion of said first surface layer to said second conductivity type, said first part of said first portion of said first surface layer being contiguous with said gate insulator layer and said second layer of said second conductivity type beneath said first surface layer, so as to extend said PN junction to said gate insulator layer;

(d) forming a layer of conductive gate material on said gate insulator layer overlying a second p&at, of said first portion of said first surface layer adjacent to said first part thereof; and (e) defining a channel region in said second part of said first portion of said first surface layer of said first conductivity type by forming a region of said second conductivity type in a second portion of said first surface layer contiguous with said second part of said first portion of said first surface layer, so as to be spaced apart from said part of said first portion of said first surface layer by said second part of said first portion therebetween.

* * * * *